United States Patent
Abessolo Bidzo et al.

(10) Patent No.: US 10,937,782 B2
(45) Date of Patent: Mar. 2, 2021

(54) ELECTROSTATIC DISCHARGE PROTECTION STRUCTURE

(71) Applicant: NXP B.V., Eindhoven (NL)

(72) Inventors: Dolphin Abessolo Bidzo, Nijmegen (NL); Janusz Tomasz Klimczak, Hamburg (DE); Detlef Clawin, Hamburg (DE); Radu Mircea Secareanu, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 401 days.

(21) Appl. No.: 15/705,017

(22) Filed: Sep. 14, 2017

(65) Prior Publication Data

US 2019/0081037 A1 Mar. 14, 2019

(51) Int. Cl.
*H01L 27/02* (2006.01)
*H02H 9/04* (2006.01)
*H01L 27/06* (2006.01)
*H01L 23/66* (2006.01)
*H01L 23/522* (2006.01)
*H01L 49/02* (2006.01)

(52) U.S. Cl.
CPC ...... *H01L 27/0288* (2013.01); *H01L 23/5225* (2013.01); *H01L 23/66* (2013.01); *H01L 27/0255* (2013.01); *H01L 27/0676* (2013.01); *H01L 28/10* (2013.01); *H02H 9/046* (2013.01); *H01L 2223/6611* (2013.01); *H01L 2924/10253* (2013.01); *H01L 2924/10271* (2013.01); *H01L 2924/10329* (2013.01); *H01L 2924/1421* (2013.01); *H01L 2924/3011* (2013.01)

(58) Field of Classification Search
CPC ............. H01L 27/0251; H01L 2924/00; H01L 2224/73265; H01L 2224/48227; H01L 27/0288
See application file for complete search history.

(56) References Cited

U.S. PATENT DOCUMENTS

| | | | |
|---|---|---|---|
| 4,958,255 A | 9/1990 | Pritchard | |
| 6,509,779 B2 | 1/2003 | Yue et al. | |
| 2005/0041347 A1 | 2/2005 | Khorram | |
| 2005/0128664 A1 | 6/2005 | Pilling et al. | |
| 2007/0085144 A1* | 4/2007 | Chen | H01L 27/0292 257/362 |

(Continued)

OTHER PUBLICATIONS

Yue, C.P., "Design Strategy of on-chip inductors for highly integrated RF systems", Proceedings of the 36th Design Automation Conference, Jun. 21, 1999.

(Continued)

*Primary Examiner* — Marcos D. Pizarro
*Assistant Examiner* — Quinton A Brasfield (57) ABSTRACT

An electrostatic discharge, ESD, protection structure (200) formed within a semiconductor substrate of an integrated circuit device (600). The integrated circuit device (600) comprising: a radio frequency domain (632); a digital domain (610). The ESD protection structure (200) further includes an intermediate domain located between the radio frequency domain (632) and the digital domain (610) that comprises at least one radio frequency, RF, passive or active device that exhibits an impedance characteristic that increases as a frequency of operation increases.

8 Claims, 6 Drawing Sheets

(56) References Cited

U.S. PATENT DOCUMENTS

| | | | |
|---|---|---|---|
| 2008/0218920 A1* | 9/2008 | Vanysacker | H01L 27/0251 |
| | | | 361/56 |
| 2009/0262475 A1 | 10/2009 | Darabi et al. | |
| 2013/0120885 A1 | 5/2013 | Keramat et al. | |
| 2013/0176647 A1* | 7/2013 | Kireev | H03K 19/018521 |
| | | | 361/18 |
| 2016/0225758 A1* | 8/2016 | Lai | H01L 27/092 |

OTHER PUBLICATIONS

Wunsch, D. C., et al. "Determination of Threshold Failure Levels of Semiconductor Diodes and Transistors Due to Pulse Voltages", IEEE Transactions on Nuclear Science, vol. 15, No. 6, pp. 244-259 (Dec. 1968).

* cited by examiner

ELECTROSTATIC DISCHARGE PROTECTION STRUCTURE

FIELD OF THE INVENTION

The field of the invention relates to electro-static discharge (ESD) protection for use in a radio frequency (RF) application. The invention is applicable to, but not limited to a RF ESD inductor-based cross-domains ground ESD protection for RF applications.

BACKGROUND OF THE INVENTION

Integrated circuit (IC) devices are prone to electrostatic discharge (ESD) events, whereby external contacts of the IC devices are subjected to large electrical charges (positive or negative). Thus, ESD is the sudden flow of electricity between two electrically charged objects caused by contact, an electrical short, or a dielectric breakdown. A build-up of static electricity can be caused by electrostatic induction. Functional circuitry within an IC device is required to be protected from electrical currents created by such large electrical charges at the external contacts of the IC devices, which can cause erroneous behavior within the functional circuitry and even permanently damage the functional circuitry due to the magnitude of the electrical currents that can be generated by ESD events.

To protect the functional circuitry of an IC device from ESD events, it is known to provide susceptible external contacts of the IC device with ESD protection structures. ESD prevention can be part of the device itself and include special design techniques for device input and output pins. External protection components can also be used with circuit layout. Conventional ESD protection structures typically include thyristor structures (i.e. P-N-P-N semiconductor structures) coupled between an external contact to be protected, such as an input/output (I/O) contact of the IC device, and a power supply contact (e.g. ground or Vss) to which ESD currents are to be shunted. An efficient way to prevent ESD is to use materials that are not too conductive but will slowly conduct static charges away. These materials are called static dissipative and have resistivity values in the range of $10^5$ to $10^{12}$ ohm-meters. Materials in automated manufacturing which will touch on conductive areas of ESD sensitive electronic should be made of dissipative material, and the dissipative material must be grounded. However, ESD is particular problematic for radio frequency (RF) applications at frequencies above, say, 1 GHz and is therefore prevalent with vehicle communications and circuitry that frequently operate at such high frequencies.

Currently, vehicle-to-vehicle (V2V) and vehicle-to-infrastructure (V2I) communications integrated circuits (ICs) have very strict requirements for both interference and electrostatic discharge (ESD) robustness. In particular, the ICs with dedicated short-range communications (DSRC), i.e. a wireless communication standard designed for the automotive industry. Typically, the state-of-art antiparallel diodes coupling between cross-domain grounds show insufficient isolation performance.

It is known that state-of-the-art ESD protection strategies typically suffer in terms of RF isolation and/or ESD robustness, especially when implemented between a radio frequency front end (RFE) and the digital domain circuits.

Figure 1:
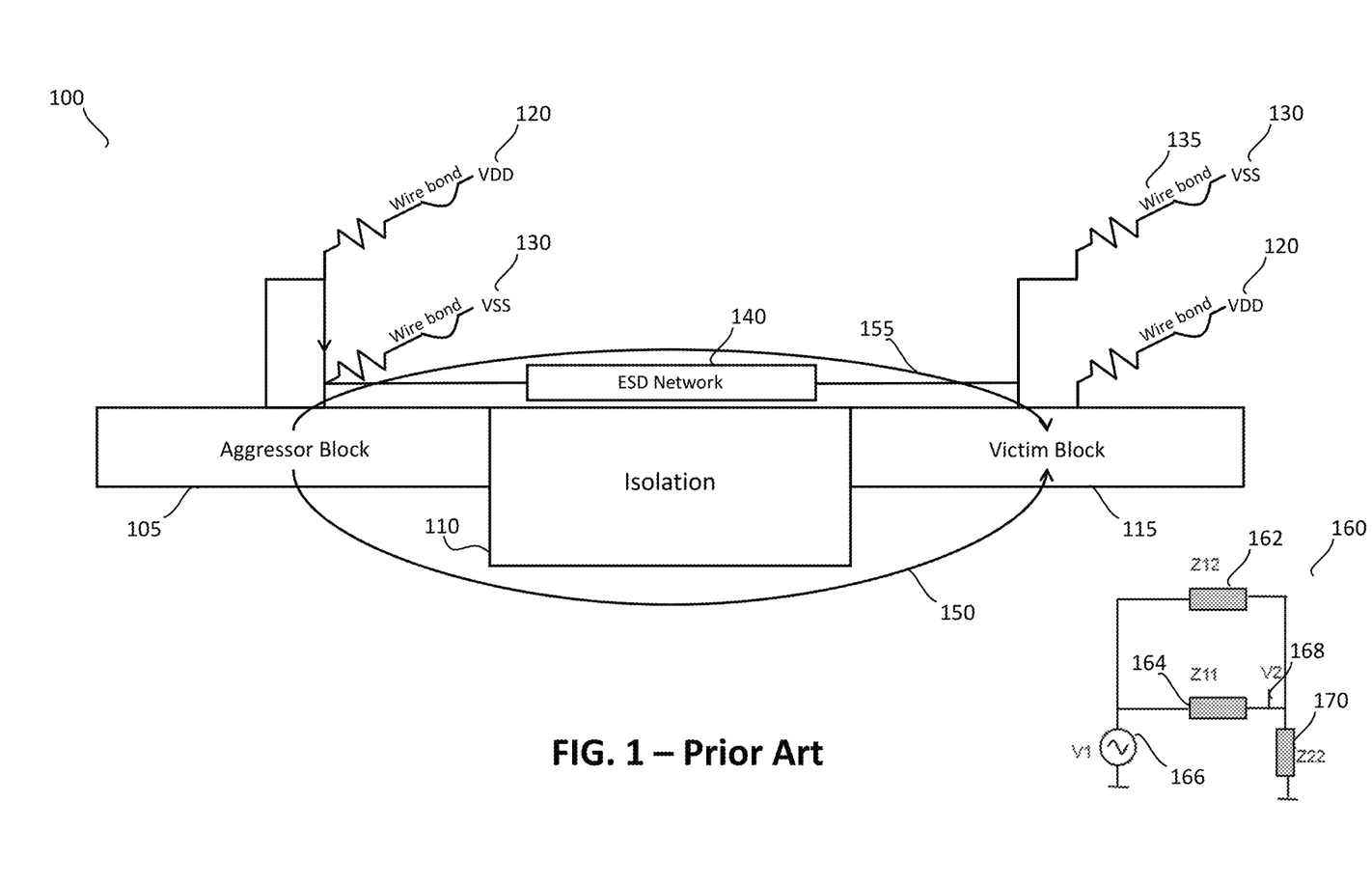
FIG. 1 illustrates a known substrate noise isolation/transmission arrangement to provide ESD protection between two circuit or component blocks.

Referring now to FIG. 1 a known substrate noise isolation/transmission arrangement 100 to provide ESD protection between two circuit or component blocks is illustrated. Here, the two circuit or component blocks are referred to as an aggressor block 105 and a victim block 115. An aggressor block 105 is a module or component injecting switching/small signal noise into a device. The victim block 115 is a module or component with a performance that is degraded by an incoming switching/small signal noise. The known substrate noise isolation/transmission arrangement 100 includes the two circuit or component blocks and an ESD network 140 being provided with a supply voltage (Vdd) 120 and a reference supply (Vss), such as ground 130. An isolation area 110 of the substrate limits noise that can traverse between the aggressor block 105 and the victim block 115. It is known that the ESD network 140 typically includes antiparallel diodes ESD network to dissipate electrostatic charge, but do also provide some low level coupling between the aggressor block 105 and the victim block 115. Noise is also transmitted through the junction capacitance of the antiparallel diodes of the ESD (protection) network 140.

Effectively, a ground network of the aggressor block 105 (e.g. a Vss_A), and a ground network of the victim block 115 (e.g. Vss_RF) are electrically coupled such that the aggressor block 105 and the victim block 115 communicate across two parallel paths, i.e. a first path 150 through the substrate, and a second path 155 through the ESD network 140, which typically consists of back-to-back diodes.

An equivalent circuit 160 of FIG. 1 is also illustrated. Here, the noise generated by the aggressor block 105 is given as a voltage V1 166. The impedance provided by the substrate on the first path 150 is represented by Z11 164. The impedance provided by the ESD network on the second path 155 is represented by Z12 162. The impedance exhibited by routing and bonding for the victim block 115 (e.g. Vss_RF) is represented by Z22 170. Thus, V2 represents the noise received at the victim block 115 from a combination of the first path 150 and the second path 155.

A first known ESD protection network 140 may use a shallow trench isolation (STI)-bound diode protection strategy. In essence, these anti-parallel diodes show a non-linear capacitance due to their junction capacitance. Whist they achieve an acceptable ESD performance, the RF isolation is poor, especially for the frequency spectrum above 1 GHz. A second known ESD protection network 140 may use a gate-bound diodes protection strategy. In essence, these antiparallel diodes exhibit a high input capacitance per width. Although the ESD robustness is sufficient, the noise isolation that these gate-bound diodes achieve does not meet the requirements due to the high capacitance spoiling the RF signal. A third known ESD protection network 140 may use a down-bonds protection strategy. In essence, in this case, there are no ESD protections implemented between ground domains at a die level, as the ground domains are 'merged' at an IC package level. The IC is therefore vulnerable to ESD stress, especially during assembly. Furthermore, although the expected isolation performance is good, since no direct capacitive coupling between ground domains exists, the Charge Device Model (CDM) robustness is very poor in this case due to voltage overshoot on the down-bonds. This is as a result of the cross-domain clamping voltage during CDM discharge being higher than the gate oxide breakdown voltage due to the Lxdl/dt fast CDM transient. Furtheremore, the on-chip ESD protection network is also meant for achieving ESD immunity at assembly line.

A CDM test is used to define the ESD that a device can withstand when the device itself has an electrostatic charge and discharges due to metal contact. This discharge type is the most common type of ESD in electronic devices and causes most of the ESD damages in their manufacturing._

CDM discharge depends mainly on parasitic parameters of the discharge and strongly depends on size and type of component package.

There are a number of designs to improve the noise transmission on the first path 150, for example making the substrate impedance much larger than the impedance (at a selected frequency) that is seen by the ESD network 140 and that routes and wire bonds the victim block to Vss 130. However, in a classic case of back-to-back diodes in the ESD network 140, there are no real options to minimise the impedance of the ESD network 140. Further, in the classic case of the back-to-back ESD diodes, as frequency increases, the noise transmission on the first path 155 becomes worse, as the impedance seen by the ESD network 140 (and that routes and wire bonds the victim block to Vss 130) increases. This is due to an inductive component from the wire-bonds 135, which can create overshoots, whilst the impedance of the ESD network 140 decreases (due to the junction capacitance of the back-to-back diodes). It is noted that the most critical behaviour of the second path 155 is at high frequency (as at low frequency, the substrate impedance is large and the impedance seen by the ESD network 140 is relatively small).

In essence, current ESD protection technique solutions are sub-optimal, particularly at high frequencies.

SUMMARY OF THE INVENTION

The present invention provides an electrostatic discharge (ESD) protection structure, as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

The inventors of the present invention have recognized and appreciated that it would be advantageous to impact the noise transmission on the second path 155 of FIG. 1 at high frequency, for example by impacting the impedance of the ESD network at high frequencies. However, in the classic case of back-to-back diodes in an ESD network, there is little that can be done to impact Z12 162 in FIG. 1. Furthermore, the inventors of the present invention have recognized and appreciated that in the classic case of back-to-back diodes in an ESD network, the noise transmission on first path 155 gets worse as the frequency increases, because Z22 170 increases (due to an inductive component from the wire-bonds), while Z12 162 decreases (due to the capacitance).

Examples of the invention advantageously leave the low-frequency behaviour of the ESD network to be the same as in the classic, back-to-back ESD diode implementation case, and instead focus on providing a solution to the impedance provided by the ESD network 140 of FIG. 1 at high frequencies (the impedance 150 of FIG. 1 (i.e. Z11) depends and is sized on different criteria, that do not relate to the object of the present invention). Examples of the invention propose an ESD protection circuit design that impacts the noise transmission on the second path (e.g. second path 140 of FIG. 1) at high frequencies, by impacting Z12 162 (of FIG. 1) at high frequencies. Essentially, Z12 162 is sized so that the noise transmission on path 140 is always maintained to be much smaller than the noise transmitted on path 150, within the frequency band of interest (and specifically at high frequencies). In some examples, a first portion of Z12 162 impedance represented by the back-to-back ESD diode capacitance, is optimized by using two series classic back-to-back ESD diodes (for example to achieve half the capacitance), while for a second portion of Z12 162 impedance introduces a series RF passive or active device, such as a RF ESD inductor to provide an impedance that increases as the frequency increases (which will increase Z12 162 in FIG. 1 as the frequency increases). In this manner, examples of the invention preserve good ESD behavior by reducing the noise transmission in the first path (and thereby ensuring that the value of V2 168 in FIG. 1 is sufficiently small).

Consequently example embodiments of the present invention find applicability in any application that is concerned with high frequency noise coupling, such as any application that integrates RF and digital circuits.

In examples of the invention, an electrostatic discharge (ESD) protection structure is formed within a semiconductor substrate of an integrated circuit device. The integrated circuit device includes: a radio frequency domain; a digital domain; and an input/output ring. At least one radio frequency, RF, ESD inductor(s) is integrated inside a respective dedicated RF bridge cell and located between the radio frequency domain and the digital domain within the input/output ring.

Figure 2:
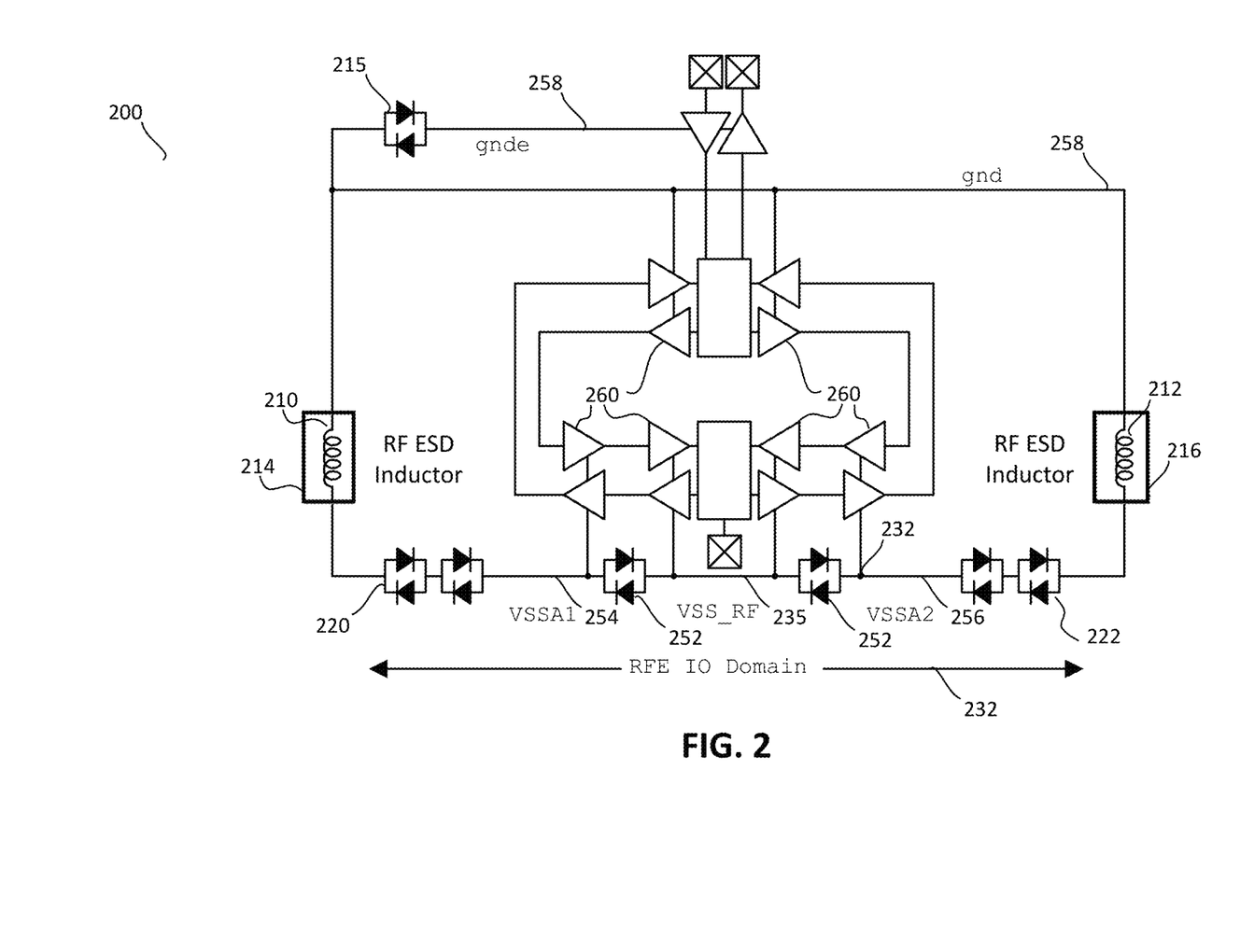
FIG. 2 illustrates a schematic circuit diagram of the RF ESD inductors, according to examples of the invention.

Referring first to FIG. 2, a schematic circuit diagram 200 illustrates a top-level view of a circuit, showing various power/ground domains according to examples of the invention. In the example schematic circuit diagram 200, a classic back-to-back ESD diode protection circuit is illustrated. In examples of the invention, the back-to-back ESD diode arrangement includes at least one RF passive or active device that exhibits an impedance characteristic that increases as a frequency of operation, where the at least one RF passive or active device provides protection between VSSA1 254 (or VSSA2 256) in an analog domain and ground (gnd) 258 in a digital domain. In this example, the at least one RF passive or active device is illustrated as RF ESD inductors 210, 212. The digital domain is the noise carrying domain.

In the example schematic circuit diagram 200 the digital domain (e.g. gnd 258) is connected with the analog domain (e.g. VSSA1 254 or VSSA2 256), and not directly with the RF domain (e.g. VSS_RF 235). In contrast to known arrangements, the analog domain of VSSA1 254 or VSSA2 256, which is less critical for noise effects and less problematic for noise transfer, is introduced between the noisy digital domain of ground 258 and the noise-sensitive RF domain 235. In this manner, a direct connection between the noisy digital domain of ground 258 and the noise-sensitive RF domain 235 is avoided. In other examples, it is envisaged that more than one intermediate domains may be introduced between the noisy digital domain of ground 258 and the noise-sensitive RF domain 235, in a voltage divider sense.

In operation, the ESD protection contains two pairs of back-to-back ESD diodes 220, 222 with a respective RF ESD inductor 210, 212. In examples of the invention, the RF ESD inductors 210, 212 are introduced in order to increase the total impedance of the path between gnd and VSSA1 (respectively VSSA2) in a frequency dependent behavior (i.e. as the frequency increases) therefore reducing the noise transmission on the respective path. In this manner, better behavior may be obtained at higher frequencies.

In some examples, the protection network further includes back-to-back ESD diodes 252 located between a first ground domain VSSA1 254 and a second ground domain VSS_RF 235 to provide ESD protection. The back-to-back ESD diodes 252 are equivalent to a capacitor as a small-signal model (coming from their junction capacitances). As the frequency increases, the capacitor impedance decreases. Therefore, at high frequencies the capacitor can become, effectively, a short-circuit, albeit relative to a wire-bond impedance at that frequency since the second ground domain VSS_RF 235 will be grounded off-chip through wire-bonds.

In some examples, the at least one RF passive or active device, e.g. RF ESD inductor 210, 212, is located as spatially close as reasonably practical to the digital domain in order to prevent the transfer of noise as soon as possible and thereby avoid propagation through, an intermediate VSSA1 254 and/or VSSA2 256 ground network and substrate.

Thus, in examples of the invention, an RF ESD inductor 210, 212 is included in the ESD protection circuit to improve ESD protection, particularly at higher frequencies, for example above 1 GHz and even more so for frequencies above 5 GHz. Furthermore, introducing one or more RF ESD inductors 210, 212 improves isolation between the respective circuits/components and domains. The schematic circuit diagram 200 includes other functional circuit elements 260 of an RF integrated circuit, such as drivers, receivers, level shifters, etc. . . . that are to be ESD protected. As illustrated, these other functional circuit elements 260 are coupled to different ground domains and thereby illustrate the cross-domain configuration that examples of the invention target to minimise cross-domain ESD stresses.

In some examples of the invention, the RF ESD inductor(s) (210, 212) may be formed in: a figure-8 shape, a circular-shape, a rectangular-shape, a donut-shape, dependent upon the prevailing design consideration and in order to provide a good inductance performance. The respective design may be selected according to a desired self-inductance value at a particular frequency as well as a circuit/package layout in order to make it ESD robust.

In some examples of the invention, the RF ESD inductors 210, 212 are integrated inside two dedicated RF bridge cells 214, 216 and respectively located at a left end side and a right end side of either a RFE or digital domain interfaces in an ESD I/O ring and separating the respective different domains. Although this example of the invention illustrates two dedicated RF bridge cells 214, 216, it is envisaged that the concept described herein may apply equally well to a single inductor (for example either first RF ESD inductor 210 or second RF ESD inductor 212) without any ESD diodes when implemented in high frequencies applications.

In some examples, in order to avoid a potential resonance with a capacitance of the antiparallel diodes 260 that could lead to a specific resonance frequency, antiparallel diodes 252 located between a first VSSA1 potential 254, a second VSSA2 potential 256 and the RF ESD inductors 210, 212 respectively, can be removed in cases where there is already a good isolation at low frequencies. In some examples, the resonance may be desired to be 'tuned out-of-band' of the frequency operation of the victim circuit, which may impact a selection of a suitable inductor value and a fine-tuning range of the RF performance of the circuit.

In some examples, the antiparallel diodes (such as antiparallel diodes 215, 220, 222) are configured to couple neighboring ground domains during an ESD stress condition, by offering a low ohmic path to the ESD discharge current. These antiparallel diodes are sized accordingly to dissipate high ESD energy. They are typically placed inside a pad ring of the integrated circuit. In some examples, these antiparallel diodes may be optional and can be removed if the overall isolation requirements are fulfilled. As illustrated, the supply rails are also split between the digital and the RFE 10 domains. The ESD protection network continuity is ensured by the RF inductors 210, 212 coupling inside the RF bridge cells 214, 216. The RF bridge cells 214, 216 are pad ring frames where the RF ESD inductors are physically located in the layout. The RF bridge cells 214, 216 are a dedicated filler cell placed inside the I/O and pad ring of an IC design in order to bridge, and ensure the ESD rails continuity, between the digital domain and the RF section of the I/O ring.

In examples of the invention, the use of the at least one RF passive or active device, e.g. RF ESD inductor 210, 212, provides a lower dynamic resistance of the circuit and therefore an improved ESD protection. The dynamic resistance is the effective impedance of the ESD protection under ESD conditions and determines the clamping voltage across the ESD protection at a given ESD stress level. The lower the dynamic resistance, the lower the clamping voltage will be and, hence, the better its ESD performance will be in terms of effectiveness in the ESD protection.

In examples of the invention, the use of the at least one RF passive or active device, e.g. RF ESD inductor 210, 212, also provides a higher failure current. The failure current indicates a maximum ESD current that the ESD protection can dissipate under ESD conditions, such that the ESD protection is more robust at higher failure currents.

Figure 3:
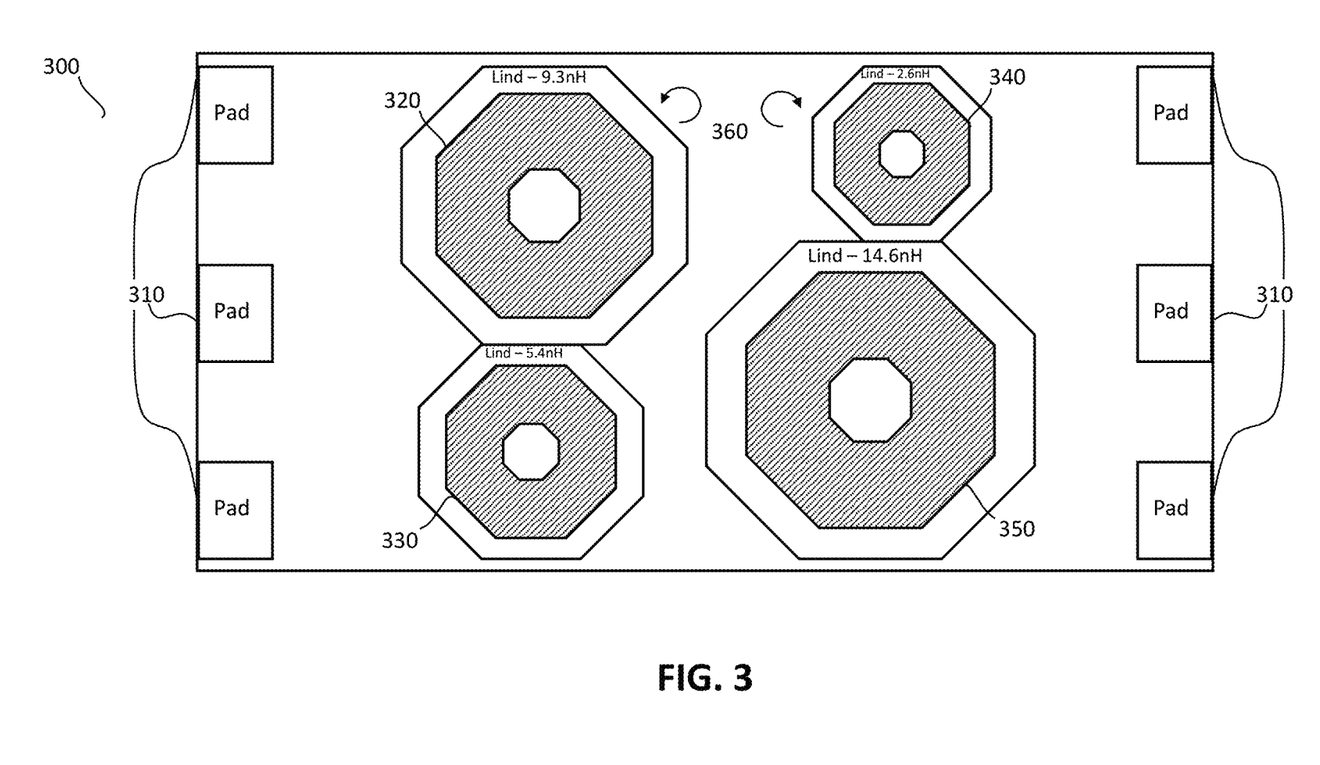
FIG. 3 illustrates a set of four RF example ESD inductor structures showing metal shielding and test pads, according to examples of the invention.

Referring now to FIG. 3, a set of four example RF ESD structures 300 showing metal shielding and test pads 310 is illustrated, according to examples of the invention. A set of four RF ESD inductors 320, 330, 340, 350 have been designed for silicon validation of the ESD protection concept as shown in the FIG. 2. These example inductors provide just a selection that can be custom fit to produce a desired ESD network impedance for a desired frequency, in order to obtain the best result. A skilled artisan will appreciate that different inductor values will affect the impedance and will provide a different response of the network. The example multi-turn RF ESD inductors 320, 330, 340, 350 have self-inductance values of about 2.7 nH, 5.4 nH, 9.3 nH and 14.7 nH respectively, and are designed in top-metal layers. In a design stage, a number of vias at an inductor bridge and the metal widths may be adjusted to fulfil ESD electro migration requirements for specific applications. In these examples of RF ESD inductors 320, 330, 340, 350, there is no centre tap in the RF ESD inductors 320, 330, 340, 350, since the use of a centre tap has ESD CDM weaknesses. Therefore, in order to further reduce the capacitance, especially the substrate capacitance of the RF ESD inductors, an optional metal1 (M1) shielding 360 is implemented underneath the inductors for example for thermal dissipation purposes. In examples of the invention, each of the RF ESD inductors 320, 330, 340, 350 is designed to be ESD robust, and are thus checked against specific ESD electromigration rules related to the number of vias at the bridges, the effective width of the metal routing, the effective resistance.

Figure 4:
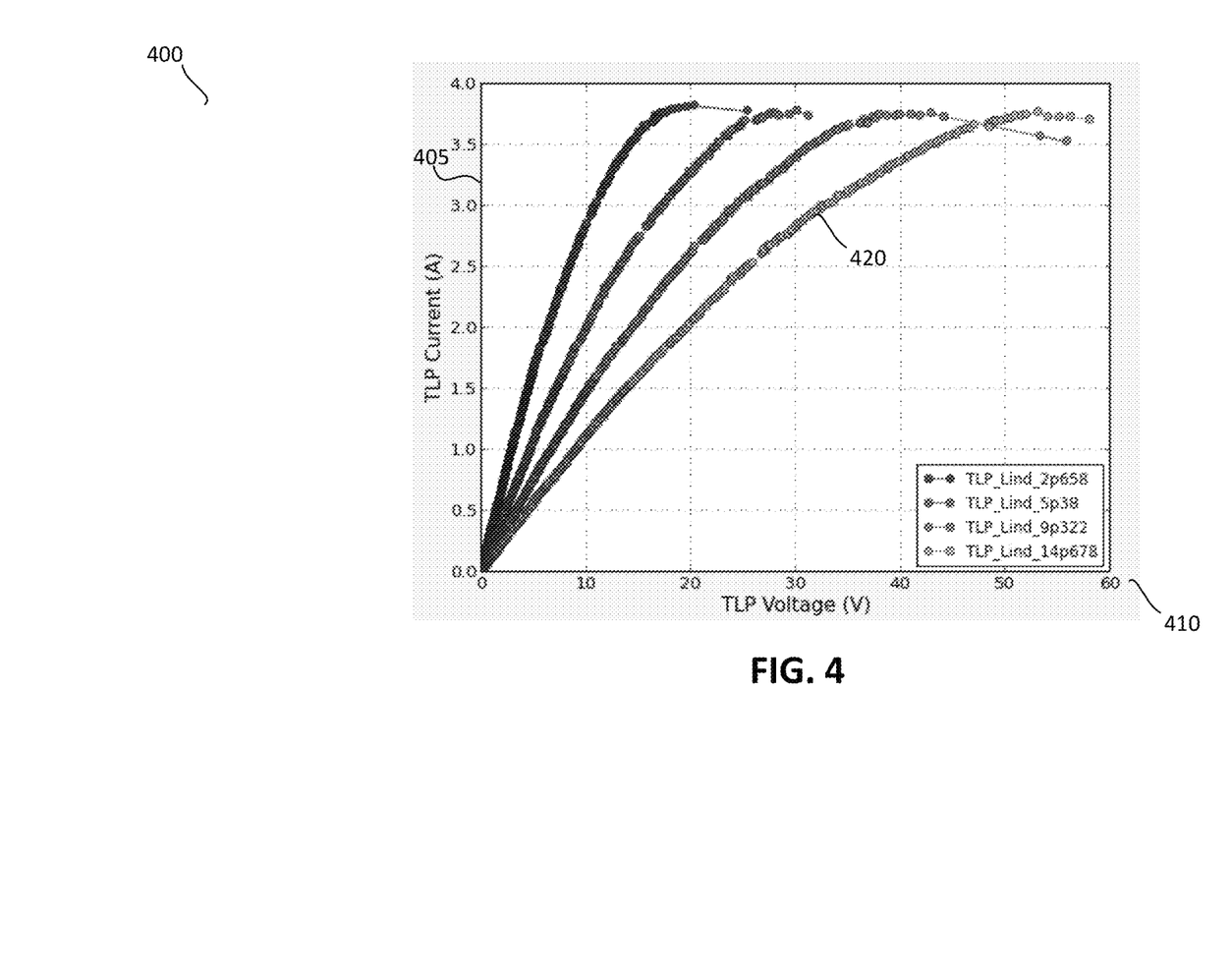
FIG. 4 illustrates a graph of a 100 ns-TLP characterization of the RF ESD inductors of FIG. 2, according to examples of the invention.

Referring now to FIG. 4, a graph 400 of Transmission Line Pulse (TLP) voltage 410 versus TLP current 405 is illustrated for a 100 ns-TLP characterization 420 of the RF ESD inductors of FIG. 2, according to examples of the invention. The ESD TLP current characterization results, with a rise time of ~10 ns and pulse width~100 nsec, show that the RF ESD inductors exhibit an ESD robustness of It 2~3.5A, equivalent to about 7 kV Human Body Model (HBM) in terms of energy. Note that, in some examples, the actual self-inductance value of the chosen RF ESD inductor should be adjusted during the initial design phase in order to achieve a clamping voltage that is lower than the gate oxide breakdown voltage of the process technology in which this ESD solution is implemented.

Figure 5:
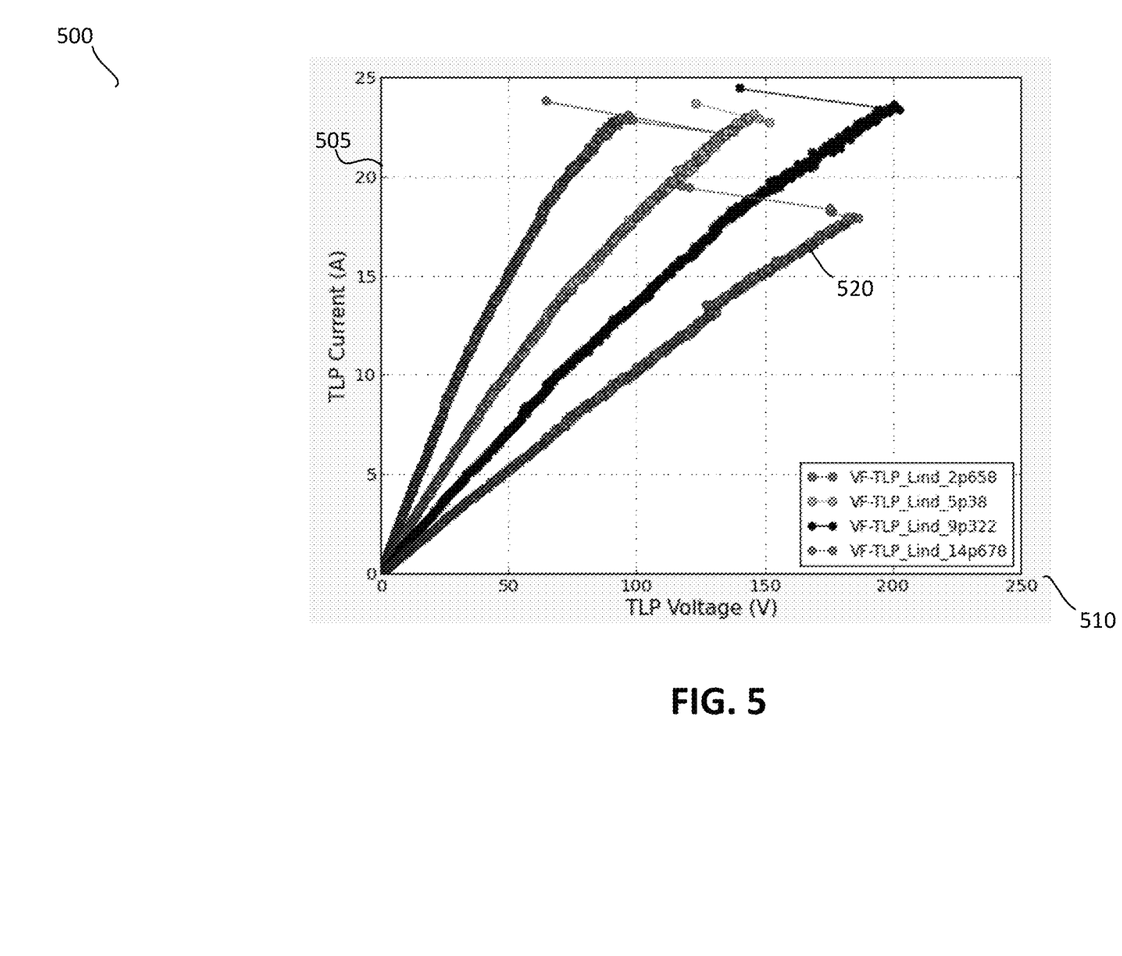
FIG. 5 illustrates a graph of vf-TLP characterization of the RF ESD inductors of FIG. 2, according to examples of the invention.

Referring now to FIG. 5, a graph 500 of Transmission Line Pulse (TLP) voltage 510 versus TLP current 505 for a very fast (vf) TLP characterization 520 of the RF ESD inductors of FIG. 2, according to examples of the invention. The vf-TLP response with a risetime of ~100 psec. and a pulse width of ~2.5 nsec. is used to mimic the CDM time domain. The pulse width and the rise time are referring to the CDM ESD standard. The vf-TLP characterization results of the RF ESD inductors show a robustness of It 2~18A. This maximum current is higher than the typical CDM peak currents. Interestingly, the very-fast Transmission Line Pulse (vf-TLP) results, which are an ESD characterization tool that mimics the CDM stress, illustrates that this design is consistent with the Wunsch-Bell power to failure theory for semiconductor devices.

Figure 6:
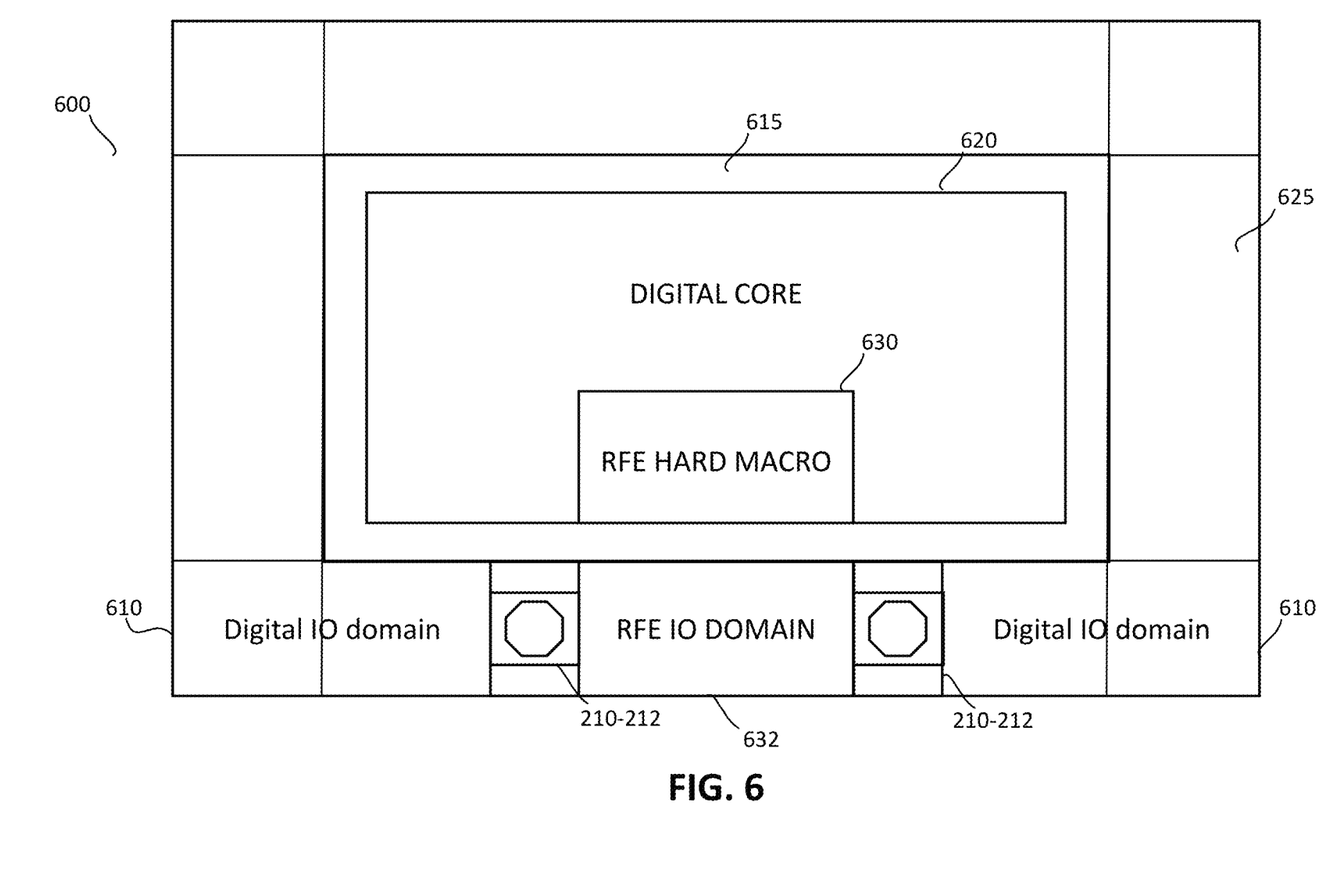
FIG. 6 illustrates an example representation of an input-output ring placed around a digital core and an RFE portion of the IC using example flowchart of a first operation of a first mutual interference mitigation mode of operation, according to example embodiments of the invention.

FIG. 6 illustrates an example representation of an input-output (I/O) ring 625 placed around a digital core 620 and a radio frequency front-end (RFE) portion 630 of an integrated circuit (IC) device 600, according to example embodiments of the invention. An electrostatic discharge, ESD, protection structure is formed within a semiconductor substrate of the IC device 600. In examples of the invention, the 10 ring 625 is a ring placed around the digital core 620 and the RFE portion 630 of the IC 600 notably with one or more integrated ESD protection inductors 210-212 and 10 functionalities, including in this example a digital I/O domain 610 and an RFE I/O domain 632.

The digital core 620 and the RFE portion 630 represent here the core circuit to be protected during any ESD stress. The area 615 indicates a separation between the digital core 620 and the 10 ring 625 that contains the primary ESD protection network.

Although examples of the invention are described with reference to ESD protection in a high frequency application such as V2V or V2I, it is envisaged that the concept herein described may equally be applied to any cross-ground domain ESD protection ICs with digital and RF building blocks, including but not limited to WiFi™, IoT, LeBT™, long term evolution (LTE™) transceivers and broadcast receivers, both narrow band and wide-band. It is also envisaged that the concept herein described may equally be applied to RF BiCMOS IC designs, such as Signal Conditioner IC for a full spectrum transceiver (FST), a transceiver for a Remote Keyless Entry (RKE), a variable gain amplifier, a medium power amplifier, a low noise amplifier, a low noise block of a satellite down-converter, an integrated low noise amplifier (LNA)/switch for a wireless local area network (WLAN), etc.

Furthermore, because the illustrated embodiments of the present invention may for the most part, be implemented using fabrication processes and procedures known to those skilled in the art, details of such processes and procedures have not been explained in any greater extent than that considered necessary for the understanding and appreciation of the underlying concepts of the present invention and in order not to obfuscate or distract from the teachings of the present invention.

It is to be understood that the term 'or' used herein is to be interpreted either exclusively or inclusively, depending upon which is broader in terms of the context. In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The words 'comprising' and 'including' do not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electrostatic discharge, ESD, protection structure formed within a semiconductor substrate of an integrated circuit device; the integrated circuit device comprising:
   a radio frequency domain;
   a digital domain; and
   the ESD protection structure characterized by:
      an intermediate analog domain, located between the radio frequency domain and the digital domain, which comprises at least one radio frequency, RF, passive or active device that exhibits an impedance characteristic that increases as a radio frequency of operation increases.

2. The ESD protection structure of claim 1, wherein the at least one RF passive or active device comprises at least one ESD inductor(s).

3. The ESD protection structure of claim 1, wherein the at least one RF passive or active device is located within an input ring or output ring located between the radio frequency domain and the digital domain.

4. The ESD protection structure of claim 3, wherein the input ring or output ring comprises a plurality of antiparallel diodes configured to provide coupling between different ground domains associated with at least one of: the radio frequency domain, the digital domain.

5. The ESD protection structure of claim 1, wherein the intermediate analog domain also comprises at least two pairs of back-to-back ESD diodes coupled to the at least one RF passive or active device thereby reducing a junction capacitance at higher frequencies.

6. The ESD protection structure of claim 2, wherein the at least one ESD inductor(s) comprise a metal shielding located underneath the ESD inductor(s) and configured to reduce a capacitance effect of the at least one ESD inductor (s).

7. The ESD protection structure of claim 1, wherein the at least one RF passive or active device is integrated on a die and configured to isolate noise between domains and components in an ESD protection network.

8. The ESD protection structure of claim 1, wherein the radio frequency domain and the at least one RF passive or active device is configured to operate between 1-2.5 GHz.

* * * * *